United States Patent [19]
Yang et al.

[11] Patent Number: 5,150,078
[45] Date of Patent: Sep. 22, 1992

[54] LOW NOISE FINE FREQUENCY STEP SYNTHESIZER

[75] Inventors: Steve S. Yang, Chatsworth; Keith P. Arnold, Canoga Park, both of Calif.

[73] Assignee: Hughes Aircraft Company, Los Angeles, Calif.

[21] Appl. No.: 799,817

[22] Filed: Nov. 29, 1991

[51] Int. Cl.$^5$ .............................................. H03L 7/00
[52] U.S. Cl. ........................................ 331/2; 455/260
[58] Field of Search ................. 331/2, 18, 25; 455/260

[56] References Cited

U.S. PATENT DOCUMENTS

| | | | |
|---|---|---|---|
| 4,234,929 | 11/1980 | Riley, Jr. | 331/2 |
| 4,388,597 | 6/1983 | Bickley et al. | 331/2 |
| 4,912,432 | 3/1990 | Galani et al. | 331/2 |
| 4,912,433 | 3/1990 | Motegi et al. | 331/8 |
| 4,940,950 | 7/1990 | Helfrick | 331/2 |
| 4,965,533 | 10/1990 | Gilmore | 331/18 |

*Primary Examiner*—Robert J. Pascal
*Attorney, Agent, or Firm*—C. D. Brown; R. M. Heald; W. K. Denson-Low

[57] ABSTRACT

A frequency synthesizer (10) and method that achieves low phase noise and provides synthesized frequency signals in fine frequency step intervals. The synthesizer (10) comprises an L-band low phase noise frequency synthesizer with fine frequency step increments. The synthesizer (10) employs half-integer digital frequency dividing (25), VCO frequency offsetting, local oscillator harmonic mixing (34) and two phase locked loop circuits (12,13). The synthesizer (10) comprises a reference oscillator (11) for providing a reference frequency signal, and two phase locked loops (12,13). The first loop (12) is the fine loop and generates the frequency step size. The second loop (13) reduces the phase noise, reduces the frequency step size and translates to the desired freqeuncy. The output from a first VCO (21) is divided by a predetermined fixed number (31) to reduce the frequency step size and to reduce the phase noise. The second loop (13) has a second VCO (32) whose output, at L-band, for example, is divided by two (33), and then mixed (34) with the third harmonic of the reference frequency signal to generate an offset frequency signal that is locked to the low phase noise fine frequency step signal of the first loop (12). The output frequency is adjusted by changing the digital programmable half-integer frequency divider (25). The low phase noise and fine frequency step frequency synthesizer (10) provides a major improvement for Doppler radar and communication receivers.

15 Claims, 1 Drawing Sheet

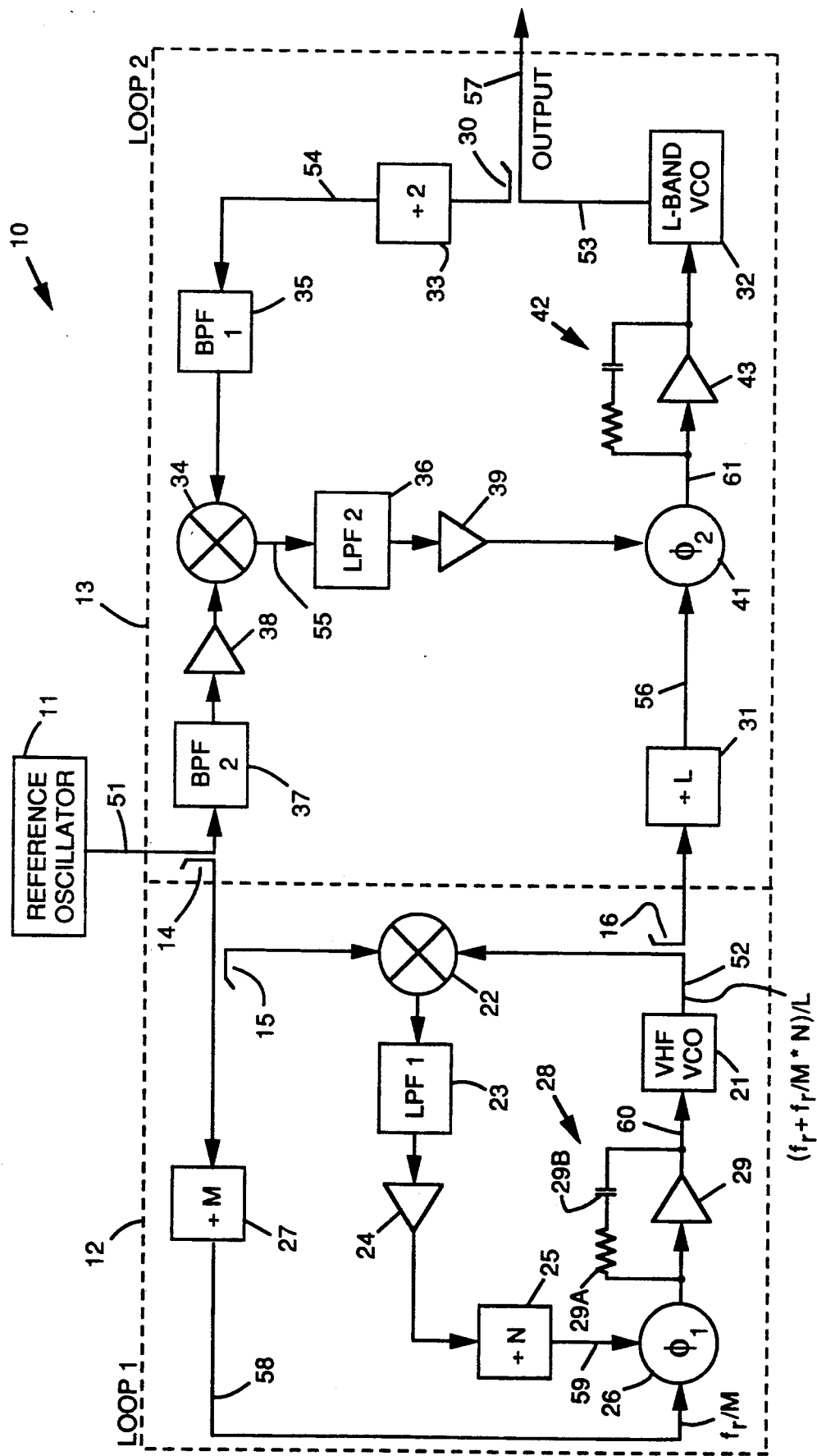

LOW NOISE FINE FREQUENCY STEP SYNTHESIZER

BACKGROUND

The present invention relates generally to frequency synthesizers, and more particularly, to a low noise, fine frequency step synthesizer.

In prior art systems, the phase locked synthesized frequency provided by a frequency synthesizer either has many fine steps with high phase noise or has low phase noise with very limited tuning step size. No conventional technology provides both low phase noise and synthesized frequencies having many fine steps at the same time. More specifically, the patents listed below disclose conventional synthesizers that cannot provide both low phase noise and synthesized frequencies having many fine steps at the same time.

The prior art patents referred to above are identified as follows: U.S. Pat. No. 4,940,950 entitled "Frequency Synthesis Method and Apparatus Using Approximation to Provide Closely Spaced Discret Frequencies Over a Wide Range with Rapid Acquisition," issued to Helfrick, U.S. Pat. No. 4,965,533 entitled "Direct Digital Synthesizer Driven Phase Lock Loop Frequency Synthesizer," issued to Gilmore, U.S. Pat. No. 4,912,433 entitled "VCO Controlled by Separate Phase Locked Loop," issued to Motegi et al., U.S. Pat. No. 4,234,929 entitled "Control Device for a Phase Lock Loop Vernier Frequency Synthesizer," issued to Riley, Jr., U.S. Pat. No. 4,388,597 entitled "Frequency Synthesizer Having Plural Phase Locked Loops," issued to Bickley et al., and U.S. Pat. No. 4,912,432 entitled "Plural Feedback Loop Digital Frequency Synthesizer," issued to Galani et al. Of these references, the Bickley et al. and Galani et al. patents disclose plural phase locked loop synthesizers, and are considered pertinent to the present invention.

The Bickley et al. patent employs three phase locked loops to achieve synthesis. The synthesizer includes a first phase locked loop comprising a mixer and a phase detector. A second phase locked loop having a programmable divider supplies a reference frequency in predetermined steps to the mixer, while a third phase locked loop provides a reference frequency in predetermined steps to the phase detector, which steps are different from the steps provided by the second phase locked loop. Also, in a preferred embodiment, a fourth phase locked loop provides a reference signal to a mixer in the third phase locked loop to reduce the operating frequency therein and the output of the fourth phase locked loop is mixed with an output from the first phase locked loop to extend the range of the synthesizer.

The Galani et al. patent discloses an indirect digital frequency synthesizer adapted to produce a signal having a selected one of a plurality of relatively closely spaced frequencies and having a relatively fast frequency switching time. Multiple feedback loops are fed by reference frequency signals whose frequency is greater than the desired frequency separation provided by the synthesizer. The bandwidth of each of the feedback loops is less than the frequency of the reference frequency fed to each loop, and achievement of frequency separation less than the frequency of either of the reference frequencies enables each of the feedback loops to have increased bandwidth and therefore reduced frequency switching times and increased noise suppression.

SUMMARY OF THE INVENTION

In order to provide for a frequency synthesizer and a method of providing synthesized output frequency signals that achieves low phase noise and provides for synthesized frequencies having many fine steps, the present invention comprises a low phase noise frequency synthesizer with fine frequency step tuning. The structure of the synthesizer is unique, and provides for half-integer digital frequency dividing, VCO frequency offsetting, and local oscillator harmonic mixing using two phase locked loop circuits. The first loop generates the required frequency steps, while in the second loop the signal is then divided by a predetermined fixed number to reduce both the frequency step size and to reduce the phase noise. The second loop output, at L-band, for example, is divided by two, and then mixed with the third harmonic of the reference frequency to generate an offset frequency that is locked to the low phase noise frequency of the first loop. The low phase noise and fine step tuning provided by the present frequency synthesizer provides a major improvement for Doppler radar and communication receivers.

More specifically, the present invention is a frequency synthesizer that comprises a reference frequency oscillator for providing a reference frequency signal. A first phase locked loop is coupled to the reference frequency oscillator for generating a first synthesized signal at a selectable one of a plurality of desired frequencies, each of the frequencies differing from an adjacent frequency by a substantially uniform frequency step size. A second phase locked loop is coupled to the reference frequency oscillator and to the first phase locked loop for generating an output signal from the synthesizer. The second phase locked loop comprises a second oscillator generating a second synthesized signal at a selectable one of a second plurality of desired frequencies. A first divider is coupled to the second oscillator for dividing the second synthesized signal by a first predetermined fixed number to produce a divided second synthesized signal. A mixer is coupled to the reference frequency oscillator and to the first divider for mixing the divided second synthesized signal with a predetermined harmonic of the reference frequency signal to produce an offset frequency signal. A second divider is coupled to the first phase locked loop for dividing the first synthesized signal by a second predetermined fixed number to produce a divided second synthesized signal having a reduced frequency step size and reduced phase noise. A phase detector is coupled to the second divider and the mixer for locking the offset frequency signal to the divided second synthesized signal.

One method in accordance with the present invention that provides synthesized output frequency signals comprises the following steps. (1) Providing a reference frequency signal. (2) Generating a first synthesized signal at a selectable one of a plurality of desired frequencies, each of the frequencies differing from an adjacent frequency by a substantially uniform frequency step size. (3) Generating a second synthesized signal at a selectable one of a second plurality of desired frequencies, which second synthesized signal comprises a synthesized output frequency signal. (4) Dividing the second synthesized signal by a first predetermined fixed number to produce a divided second synthesized signal.

(5) Mixing the divided second synthesized signal with a predetermined harmonic of the reference frequency signal to produce an offset frequency signal. (6) Dividing the first synthesized signal by a second predetermined fixed number to produce a divided second synthesized signal having a reduced frequency step size and reduced phase noise. (7) Phase locking the offset frequency signal to the divided second synthesized signal to provide the synthesized output frequency signal.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which the sole FIGURE illustrates a low noise fine frequency step synthesizer in accordance with the principles of the present invention.

DETAILED DESCRIPTION

The sole FIGURE of the drawing is a schematic diagram in block form that illustrates a preferred embodiment of a low noise fine frequency step synthesizer 10 in accordance with the principles of the present invention. The methods of the present invention will also be readily understood with reference to the drawing FIGURE. The synthesizer 10 is comprised of a low phase noise VHF reference oscillator 11 that provides a primary reference frequency signal 51, and first and second phase locked loops 12, 13 coupled to the reference oscillator 11 that are adapted to provide low phase noise and achieve fine step synthesized L-band frequencies.

The characteristics of the VHF refrence oscillator 11 are important because the phase noise of the output signal from the synthesizer 10 is dependent on and derived from it. The output frequency provided by the VHF reference oscillator 11 requires good short term frequency stability with very low AM and phase noises. The VHF reference oscillator 11 is typically a commercially available circuit using either a very high Q-factor overtone crystal or using a surface acoustic wave (SAW) resonator. The VHF reference oscillator 11 employs the least amount of frequency multiplication possible to avoid introducing multiplication noise into the primary reference frequency signal 51.

The first phase locked loop 12 is the fine or VHF step tuning loop 12, and is shown at the left side of the drawing figure. The first phase locked loop 12 is adapted to generate a synthesized signal 52 having fine frequency steps. It is comprised of a VHF voltage controlled oscillator (VCO) 21 having its output connected to one input of a mixer 22, an RF low pass filter 23 connected to the output of the mixer 22, and an RF amplifier 24 connected from the low pass filter 23 to a half-integer digital programmable frequency divider 25. The details of the half-integer divider 25 are more fully discussed in U.S. Pat. No. 4,975,931 issued Dec. 4, 1990 to Albert E. Cosand, and assigned to the assignee of the present invention. The contents of this patent are incorporated herein by this reference. The first phase locked loop 12 is coupled to the output of the VHF reference oscillator 11 by first and second couplers 14, 15. The first coupler 14 couples the primary reference frequency signal 51 to a fixed frequency divider 27. The second coupler 15 couples the primary reference frequency signal 51 to the mixer 22. The output of the fixed frequency signal 51 to the mixer 22. The output of the fixed frequency divider 27 is connected to one input of a phase detector 26. The output of the half-integer digital programmable frequency divider 25 is coupled to the other input of the phase detector 26. The output of the phase detector 26 is coupled by way of a video loop filter 28 to the control input of the VHF VCO 21. The video loop filter 28 comprises an operational amplifier 29 having a resistor 29A in series with a capacitor 29B connected from input to output. The output of the first phase locked loop 12 is coupled into the second phase locked loop 13 by a third coupler 16.

To get the lowest phase noise in the first phase locked loop 12, the frequency of the VHF VCO 21 is not directly divided down and locked to the step reference frequency, but is offset by the primary reference frequency from the VHF reference oscillator 11. The digital programmable frequency divider 25 divides the offset frequency by half-integer steps to avoid increased dividing phase noise. By implementing these two processing steps, the rate of phase noise increase is reduced to a minimum. The offset frequency signal 51 is produced at the output of the mixer 22. The mixer 22 not only creates the offset frequency signal 51, but also generates unwanted spurious high frequency signals as well. Therefore, the RF low pass filter 23 is necessary to suppress these spurious high frequency signals.

After the RF low pass filter 23 cleans up the offset frequency signal 53, it is amplified by the amplifier 24 to a high enough level to drive the half-integer digital programmable frequency divider 25, also called a divide-by-N frequency divider 25. The divide-by-N frequency divider 25 divides the offset frequency signal 53 by a predetermined count. Then the phase of the output signal 59 of the divide-by-N frequency divider 25 is compared with the phase of a fine step reference frequency signal 58 provided by the reference oscillator 11 after being divided by the fixed frequency divider 27, also called a divide-by-M fixed frequency divider 27. Then the output voltage of phase detector 26 is passed through the video loop filter 28 and the operational amplifier 29 to adjust and control the frequency, phase, and phase noise of the VHF VCO 21 after the loop is closed.

The operation of the first phase locked loop 12 will be illustrated with a specific example. The VHF reference oscillator 11 may provide a primary reference frequency of 250 MHz, for example. The primary reference frequency signal 51 is coupled through the first coupler 14 to the fixed frequency divider 27 which may divide by 250, for example. This provides a frequency of 1 MHz to one input of the phase detector 26. The VHF VCO 21 may provide an output frequency of 280 MHz, for example. The 280 MHz signal is coupled into one input of the mixer 22, and the 250 MHz primary reference frequency signal 51 is coupled into the other input of the mixer 22 by the second coupler 15. The mixer 22 produces sum and difference frequencies, but the RF low pass filter 23 passes only 280−250=30 MHz. The RF amplifier 24 amplifies the 30 MHz signal to a sufficiently high level and applies it to the programmable frequency divider 25. The programmable frequency divider 25 may be set to divide by 30, for example. The output of the programmable frequency divider 25 is 1 MHz which is applied to the phase detector 26. Since the phase detector 26 has 1 MHz applied to its other input, the VHF VCO 21 is locked to exactly 280 MHZ which is the frequency that is coupled into the second phase locked loop 13 by the third coupler 16. It will be understood that by varying the half-integer digital programmable frequency divider 25, the frequency of the VHF VCO 21 may be varied in increments or steps.

The second or L-band phase locked loop 13 is shown at the right side of the drawing figure. The L-band loop 13 converts the frequency provided by the first frequency locked loop 12 to L-band frequency, for example. The output signal 52 of the VHF VCO 21 is passed through a divide-by-L frequency divider 31 that reduces both its fine step frequency and its phase noise and provides a divided second reference frequency signal 56. The fixed frequency divider 27 and the divide-by-L frequency divider 31 cooperate to reduce the frequency step size. The second phase locked loop 13 is comprised of an L-band VCO 32, a divide-by-two divider 33, a harmonic mixer 34, three RF filters 35, 36, 37, two RF amplifiers 38, 39, the divide-by-L frequency divider 31, the phase detector 41, and a video amplifier 43 with a loop filter 42.

The frequency of the synthesized output signal 53 provided by the L-band VCO 32 is divided by two by the divide-by-two divider 33 to provide a divided second synthesized signal 54 (or half VCO frequency signal 54) and then filtered by the first bandpass filter 35 to suppress harmonics generated by the divide-by-two divider 33. Then the half VCO frequency signal 54 produced by the divide-by-two divider 33 is mixed with the third harmonic of the reference frequency signal 51 at the harmonic mixer 34. The frequency of the signal 51 produced by the reference oscillator 11 is filtered by second bandpass filter 37 to prevent out-of-band noise, and is then amplified by the first RF amplifier 38 to provide a signal having a high enough level to drive the harmonic mixer 34. In this way, the second phase locked loop 13 avoids multiplying the reference oscillator frequency by six and reduces the circuit complexity. An offset frequency signal 55 produced by the mixer 34 is passed through the low pass filter 36 to suppress unwanted frequencies generated by the mixer 34. Subsequently the offset frequency signal 55 is amplified in RF amplifier 39 to a level sufficient to drive the phase detector 41.

The signals provided by the VHF VCO 21 are divided by L in the divide-by-L divider 31 to reduce fine step frequency size and phase noise. The divided output signal from the VHF VCO 21 becomes a second reference frequency signal 56 for the L-band offset frequency. The phases of the two signals 55, 56 are compared in the phase detector 41, and the voltage of its phase difference signal 61 is amplified by the video amplifier 43 and its loop filter 42 to adjust and control the frequency, phase and phase noise of the output of the L-band VCO 32 after closing the second loop 13. As a consequence, the synthesizer 10 produces fine step synthesized frequency output signals 57 having low phase noise.

To continue the specific example given with respect to the first phase locked loop 12, the second phase locked loop 13 operates as follows. The VHF reference oscillator 11 provides a reference signal 51 at 250 MHz, for example, to the second phase locked loop 13. The VHF VCO 21 provides an output signal 52 of 280 MHz, for example, to the second phase locked loop 13. The L-band VCO 32 may provide an output signal 53 at 1388 MHz, for example. This output signal 53 is coupled out of the second phase locked loop 13 by a fourth coupler 30 as the synthesizer output signal 57. In operation, the divide by L divider 31 may divide by 5, for example, and have an output frequency of 280/5=56 MHz. The bandpass filter 37 passes the 250 MHz signal 51 from the VHF reference oscillator 11 but suppresses the noise above and below the 250 MHz signal. The RF amplifier 38 amplifies the 250 MHz signal to a level sufficient to drive the third harmonic mixer 34. The third harmonic of the 250 MHz signal, or 750 MHz, is present in the mixer 34. The 1388 MHz signal 53 from the L-band VCO 32 is divided by two to provide a signal 54 of 694 MHz at the output of the divide by two divider 33. The bandpass filter 35 passes only the 694 MHz signal to the third harmonic mixer 34. The mixer 34 produces sum and difference frequencies, but the low pass filter 36 selects only 750−694=56 MHz. The 56 MHz signal is amplified by RF amplifier 39 to provide a level sufficient to drive the phase detector 41. It is understood that the L-band VCO 32 is locked by the loop through the amplifier 43.

The output frequency of the preferred embodiment of the frequency synthesizer of the present invention may be calculated by using the following equation:

$$F_{32} = 2[3 \pm (1 \pm N/M)/L] F_{11} \quad (1)$$

where: $F_{32}$ is the output frequency of the L-band VCO 32; $F_{11}$ is the output frequency of the low phase noise VHF reference oscillator 11; and $(1 \pm N/M)$ represents the operation of the first phase locked loop 12 in which N is the dividing number of the half-integer digital programmable frequency divider 25. This is a half integral increment divider to double the frequency steps. M represents the dividing number of the fixed frequency divider 27 and is used to generate the frequency step size of the first phase locked loop 12. L is the dividing number of the divide-by-L frequency divider 31 which reduces step size and phase noise of the first loop 12. The number 3 appears in equation (1) because of the third harmonic mixing that occurs in the harmonic mixer 34. The number 2 appears in equation (1) because of the frequency being reduced by two in the divide-by-2 divider 33 of the second phase locked loop 13.

The phase noise of the preferred embodiment of the frequency synthesizer of the present invention may be determined by starting with the reference signal 51 from the reference oscillator 11 and applying the appropriate multiplication factors and dividing factors. The closed-in phase noise of the output signal of the preferred embodiment of the invention is determined by the noise slope generated by the reference oscillator 11 and is increased by the various multiplication factors. The noise floor of the output signal of the preferred embodiment of the invention is derived from the dividing number of the half-integer digital programmable frequency divider 25 and the dividing number of the divide-by-L frequency divider 31 which is the output noise floor of the fixed frequency divider 27 increased by the dividing factor of N and reduced by the dividing factor of L. Hence, the noise power of the preferred embodiment of the system can be represented by following simplified equation as:

$$L(fm)_{57} = 2^2 [3^2 L(fm)_{11} + (N/L)^2 (KTBF_D G_D)/(2P_o)] \quad (2)$$

where: $L(fm)_{57}$ is the output signal phase noise spectrum of the preferred embodiment of the invention; $2^2$ is the system noise power increased due to the L-band phase locked loop 13 divided by 2; and the term $3^2 L(fm)_{11}$ is the close-in phase noise spectrum increased due to the third order harmonic mixing of the reference oscillator 11, where $L(fm)_{11}$ is the phase noise spectrum of the reference oscillator 11. The second term $(N/L)^2 (KTBF_D G_D)/(2P_o)$ is the fixed frequency divider 27 output signal to noise ratio $(KTBF_D G_D)/(2P_o)$ increased by the square of the divided number N, reduced by the square of the divided number L. In this term, the closed-in phase noise spectrum was omitted because it is too small compared to the reference oscillator 11 taking the multiplication factors into account, particularly after it is divided by L.

From the foregoing description, it should be clearly understood that the frequency synthesizer 10 of the present invention provides low phase noise along with fine frequency step tuning. This performance is due to the unique synthesizer configuration employing half-integer digital frequency dividing, VCO frequency offsetting, local oscillator harmonic mixing, and two phase locked loop circuits. The first loop generates the required frequency steps. The output of the voltage controlled oscillator in the first loop is divided by a predetermined fixed number to reduce both the frequency step size and the phase noise. The output of the L-band voltage controlled oscillator in the second loop is divided by two and then mixed with the third harmonic of the reference frequency from the reference oscillator to generate an offset frequency. This offset frequency is then locked to the divided low phase noise fine frequency step output from the first loop. In summary, the first loop 12 is the fine loop and generates the frequency step size. The second loop 13 reduces the phase noise, reduces the frequency step size and translates to the desired frequency. This results in a low cost circuit that provides excellent performance. This low phase noise and fine step size frequency synthesizer provides a major improvement for Doppler radar and communication receivers.

To summarize one method in accordance with the principles of the present invention, it comprises the following steps. Providing a reference frequency signal 51. Generating a first synthesized signal 52 at a selectable one of a plurality of desired frequencies, each of the frequencies differing from an adjacent frequency by a substantially uniform frequency step size. Generating a second synthesized signal 53 at a selectable one of a second plurality of desired frequencies, which second synthesized signal 53 comprises a synthesized output frequency signal 57. Dividing the second synthesized signal 53 by a first predetermined fixed number to produce a divided second synthesized signal 54. Mixing the divided second synthesized signal 54 with a predetermined harmonic of the reference frequency signal 51 to produce an offset frequency signal 55. Dividing the first synthesized signal 52 by a second predetermined fixed number to produce a divided second reference frequency signal 56 having a reduced frequency step size and reduced phase noise. Phase locking the offset frequency signal 55 to the divided second reference frequency signal 56 to provide the synthesized output frequency signal 57. The step of phase locking the offset frequency signal 55 to the divided second reference frequency signal 56 typically comprises the steps of comparing the phases of the second offset frequency signal 55 and the divided second reference frequency signal 56 to provide a second control signal 61 that locks the output frequency of the second synthesized signal 53 to provide the synthesized output frequency signal 57.

Thus there has been described a new and improved low noise, fine frequency step synthesizer. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A frequency synthesizer comprising:

reference frequency oscillattor means (11) for providing a reference frequency signal (51);

a first phase locked loop (12) coupled to the reference frequency oscillator means (11) for generating a first synthesized signal (52) at a selectable one of a plurality of desired frequencies, each of the frequencies differing from an adjacent frequency by a substantially uniform frequency step size; and a second phase locked loop (13) coupled to the reference frequency oscillator means (11) and to the first phase locked loop (12) for generating an output signal (57) having a predetermined frequency said second phase locked loop (13) comprising second oscillator means (32) for generating a second synthesized signal (53) at a selectable one of a second plurality of desired frequencies, first divider means (33) coupled to the second oscillator means (32) for dividing the second synthesized signal (53) by a first predetermined fixed number to produce a divided second synthesized signal (54), mixing means (34) coupled to the reference frequency oscillator (11) and to the first divider means (33) for mixing the divided second synthesized signal (54) with a predetermined harmonic of the reference frequency signal (51) to produce an offset frequency signal (55), second divider means (31) coupled to the first phase locked loop (12) for dividing the first synthesized (52) by a second predetermined fixed number to produced a divided second reference frequency signal (56) having a reduced frequency step size and reduced noise, and phase detector means (41) coupled to the mixing means (34) and to the second divider means (31) for locking the offset frequency signal (55) to the divided second reference frequency signal (56).

2. The frequency synthesizer of claim 1 wherein the first phase locked loop (12) is adapted to provided a first synthesized signal (52) at a selectable one of a first plurality of VHF frequencies and the second phase locked loop (13) is adapted to provide a second synthesized signal (53) at a selectable one of a second plurality of L-band frequencies.

3. The frequency sythesizer of claim 1 wherein the second phase locked loop (13) further comprises a first bandpass filter (35) coupled between the first divider means (33) and the mixing means (34).

4. The frequency synthesizer of claim 1 wherein the second phase locked loop (13) further comprises a serially coupled second bandpass filter (37) and first amplifier (38) coupled between the reference frequency oscillator (11) and the mixing means (34).

5. The frequency synthesizer of claim 1 wherein the second phase locked loop (13) further comprises a serially coupled first low pass filter (36) and second amplifier (39) coupled between the mixing means (34) and the phase detector means (41).

6. The frequency synthesizer of claim 1 wherein the second phase locked loop (13) further comprises a loop filter (42) coupled between the phase detector means (41) and the second oscillator means (32).

7. A frequency synthesizer comprising:
   a reference frequency oscillator (11) for providing a reference frequency signal (51);
   a first phase locked loop (12) adapted to generate a synthesized signal (52) at a selectable one of a plurality of desired frequencies, each of the frequencies differing from an adjacent frequency by a substantially uniform frequency step size, the first phase locked loop comprising a first voltage controlled oscillator (21) for providing a relatively low phase noise signal, a first mixer (22) adapted to mix the reference frequency signal (51) and the low phase noise signal, a first fixed frequency divider (27) for dividing the reference frequency signal (51) by a first predetermined number to provide a divided reference frequency signal (58), a digital programmable half-integer frequency divider (25) coupled to the mixer (22) for providing a first offset frequency signal (59), a first phase detector (26) for comparing the phase of the first offset frequency signal (59) and the phase of the divided reference frequency signal (58) to provide a first control signal (60) that is adapted to lock the first voltage controlled oscillator (21); and
   a second phase locked loop (13) comprising a second voltage controlled oscillator (32), a second divider (33) for dividing the output of the second voltage controlled oscillator (32) by a second predetermined number to provide a divided signal (54), a second mixer (34) adapted to mix a predetermined harmonic of the reference frequency signal (51) with the divided signal (54) to produce a second offset frequency signal (55), a third divider (31) coupled to the first voltage controlled oscillator (21) for dividing the low noise signal (52) by a third predetermined number to provide a divided second reference frequency signal (56), a second phase detector (41) for comparing the phases of the second offset frequency signal (55) and the divided second reference frequency signal (56) to provide a second control signal (61) that is adapted to lock the second voltage controlled oscillator (32).

8. A mehtod of providing a synthesized output frequency signal comprising the steps of:
   providing a reference frequency signal (51);
   generating a first synthesized signal (52) at a selectable one of a plurality of desired frequencies, each of the frequencies differing from an adjacent frequency by a substantially uniform frequency step size;
   generating a second sythesized signal (53) at a selectable one of a second plurality of desired frequencies, which second synthesized signal (53) comprises a synthesized output frequency signal (57);
   dividing the second synthesized signal (53) by a first predetermined fixed number to produce a divided second sythesized signal (54);
   mixing the divided second synthesized signal (54) with a predetermined harmonic of the reference frequency signal (51) to produce and offset frequency signal (55);
   dividing the first synthesized signal (52) by a second predetermined fixed number to produced a divided second frequency signal (56) having a reduced frequency step size and reduced phase noise; and
   phase locking the offset frequency signal (55) to the divided second reference frequency signal (56) to provide the synthesized output frequency signal (57).

9. The method of providing a synthesized output frequency signal of claim 8 wherein the step of generating the first synthesized signal (52) comprises generating a VHF-band frequency signal and the step of generating the second synthesized signal (53) comprises generating an L-band frequency signal.

10. The method of providing a synthesized output frequency signal of claim 8 further comprising the step of bandpass filtering (35) divided second sythesized signal (54) prior to mixing it with the predetermined harmonic of the reference frequency signal (51).

11. The method of providing a synthesized output frequency signal of claim 8 further comprising the step of bandpass filtering (37) and amplifying (38) the reference frequency signal (51) prior to mixing it with the divided second synthesized signal (54).

12. The method of providing a synthesized output frequency signal of claim 8 further comprising the step of low pass filtering (36) and amplifying the offset frequency signal (55) prior to locking it to the divided second reference frequency signal (56).

13. The method of providing a sythesized output frequency signal of claim 8 wherein the step of phase locking the offset frequency signal (55) to the divided second reference frequency signal (56) comprises the step of comparing the phases of the second offset frequency signal (55) and the divided second reference frequency signal (56) to provide a second control signal (61) that locks the output frequency of the second synthesized signal (53) to provide the synthesized output frequency signal (57).

14. The method of providing a synthesized output frequency signal of claim 13 further comprises the step of filtering the control signal (61).

15. A method of providing a plurality of synthesized frequency signals comprising the steps of:
   providing a reference frequency signal (51);
   generating a first synthesized signal (52) at a selectable one of a plurality of desired frequencies, each of the frequencies differing from an adjacent frequency by a substantially uniform frequency step size;
   generating a second synthesized signal (53) at a selectable one of a second plurality of desired frequencies, which second sythesized signal (53) comprises a synthesized output frequency signal (57);
   dividing the second synthesized signal (53) by a first predetermined fixed number to produce a divided second synthesized signal (54);
   mixing the divided second synthesized signal (54) with a predetermined harmonic of the reference frequency signal (51) to produce an offset frequency signal (55);
   dividing the first synthesized signal (52) by a second predetermined fixed number to produce a divided second reference frequency signal (56) having a reduced frequency step size and reduced phase noise; and
   phase locking the offset frequency signal (55) to the divided second reference frequency signal (56) by comparing the phases of the second offset frequency signal (55) and the divided second reference frequency signal (56) and providing a second control signal (61) that locks the output frequency of the second synthesized signal (53) to provide the synthesized output frequency signal (57).

* * * * *